United States Patent [19]

Wiendl

[11] Patent Number: 4,816,980
[45] Date of Patent: Mar. 28, 1989

[54] CONVERTER SYSTEM FOR COUPLING TWO HIGH VOLTAGE THREE-PHASE NETWORKS

[75] Inventor: Heinz Wiendl, Nuernberg, Fed. Rep. of Germany

[73] Assignee: Siemens Aktiengesellschaft, Berlin and Munich, Fed. Rep. of Germany

[21] Appl. No.: 203,681

[22] Filed: Jun. 7, 1988

[30] Foreign Application Priority Data

Jul. 13, 1987 [DE] Fed. Rep. of Germany ....... 3723123

[51] Int. Cl.$^4$ .............................................. H02J 3/36
[52] U.S. Cl. ........................................ 363/35; 363/68; 363/144
[58] Field of Search ............... 363/35, 37, 51, 68, 363/141, 144, 159–161; 361/333, 334

[56] References Cited

U.S. PATENT DOCUMENTS

| | | | |
|---|---|---|---|
| 3,889,175 | 6/1975 | Isogai et al. | 363/68 |
| 4,583,158 | 4/1986 | Ikekame et al. | 363/68 |
| 4,618,923 | 10/1986 | Meisel et al. | 363/35 |
| 4,691,274 | 9/1987 | Matouk et al. | 363/141 |

Primary Examiner—Peter S. Wong
Attorney, Agent, or Firm—Kenyon & Kenyon

[57] ABSTRACT

The converter system couples two high voltage three-phase networks. Two converter transformers are associated with each network to be coupled. Each transformer has secondary windings. One secondary winding associated with a first network is Y-connected while the other is delta-connected. The converter transformers operate on a three-phase full wave rectifier with twelve semiconductor rectifier components. The arrangement of valve towers, a stacking of semiconductor components, is designed to keep a base area or a so-called valve housing in which the valve towers are accommodated as small as possible. The semiconductor components are arranged in uniform modular assemblies and may be stacked as modular components having insulating spacings between components which are also uniform. A tower of uniform modules is formed in association with each of the phases of the three-phase secondary windings of the converter transformers. The number of modules defines the number of stories of the tower. The number of modules is varied in accordance with the desired power throughput. The system provides DC short couplers for asynchronous networks of different powers while uitilizing the same basic design concept so that a power match can be made by a corresponding number of modules forming a tower with the same insulating spacings in a standardized design.

7 Claims, 3 Drawing Sheets

CONVERTER SYSTEM FOR COUPLING TWO HIGH VOLTAGE THREE-PHASE NETWORKS

BACKGROUND OF THE INVENTION

This invention relates to a converter system for coupling two high voltage three-phase networks. In particular, this invention is related to a converter system employing a three-phase full-wave converter associated with each of the AC networks to be coupled where the converters include two three-phase secondary windings and a semiconductor subassembly associated with each of the secondary windings.

Known converter systems for providing connections between two asynchronous AC networks include a three-phase full-wave converter arrangement associated with each of the two networks to be coupled.

Each converter arrangement includes two three-phase transformers each with two three-phase secondary windings. One secondary winding of each three-phase transformer is Y-connected while the other secondary winding is delta-connected.

Each converter arrangement further includes a plurality of semiconductor devices which are controlled by a central control circuit. The central control circuit operates such that the converter arrangement connected to the AC network operating as an input network acts as a rectifier. Similarly, the converter arrangement coupled to the AC network which is operating as the receiving network is caused to act as an inverter.

The controlled semiconductors are arranged in the form of uniform functional groups in a modular design. Each functional group includes a valve choke, a number of thyristors, a mounting frame and terminal elements. Each group includes mounting elements for fastening spacer insulators so that a plurality of functional groups may be stacked upon one another to create converter towers or valve towers. The phases of the secondary windings are connected to functional groups in the converter tower.

A decoupled DC circuit in the form of a three-phase to DC to three-phase converter is arranged between two asynchronous networks (networks having different frequency behavior) so as to connect the networks to each other for the purpose of exchanging power. In the three-phase to DC to three-phase configuration, high voltage DC transmission takes place over a very short distance. This type of DC circuit is called a DC short coupler.

A DC short coupler is known from "Oesterreichische Zeitschrift Fuer Elektrizitaetswirtschaft", Vol. 36, No. 8–9 pages 265ff. The arrangement described in this disclosure essentially includes two full-wave converter arrangements which are connected to each other on their DC sides and are connected on their three-phase side to the two networks respectively. The two full-wave converter arrangements contain controlled rectifier components (thyristors) instead of passive rectifier valves. This allows a power exchange between the two coupled AC networks in both directions as desired. The converter arrangement associated with the network that is feeding power is operated as a rectifier and the converter arrangement associated with the network receiving the power is operated as an inverter. The thyristors are controlled via a central electronic thyristor circuit whereby each thyristor is associated with an electronic thyristor circuit assembly which consists of a power unit for forming and delivering an electrical firing pulse, electronic circuitry for processing information and a signal transmission unit. The signals are transmitted in this converter arrangement via light waveguides such as fiber optic cables.

In a further converter arrangement disclosed in DE-OS3404076, two converter transformers are associated with each network. That is, the arrangement includes two primary three-phase windings and two secondary three-phase windings associated with each AC network to be coupled. The secondary windings of the converter transformers are such that one of the secondary windings associated with an AC network is Y-connected and while the other secondary winding associated with the winding is delta-connected. Together the secondary windings act upon a three-phase full wave rectifier having twelve semiconductor rectifier components. Each converter transformer associated with a three-phase network has a secondary winding also having three phases. Each of the three phases for each of the secondary windings is associated with two series connected semiconductor components. Each semiconductor component includes two series connected thyristors. Four such thyristors are included in a semiconductor subassembly. The semiconductor subassemblies are commonly arranged as modules stacked atop each other to form a so called valve tower. As described in this reference, one valve tower is provided for each of the four secondary windings of the converter arrangement. There are two valve towers for each network. According to the disclosure, all three phases of a given secondary winding are coupled to the same valve tower. The reference discloses that the phases are connected to different modules in the same stack or tower of valve modules.

The valve towers are to be mounted in valve sheds or housings in a base area of the converter arrangement. The configuration of providing one valve tower per secondary winding is useful for reducing the base area necessary to contain the converter arrangement. It is sufficient that the valve housing does not require a separate area beneath the towers for control electronics, used to control the semiconductor subassemblies, which are also called base electronics, because relatively short signal transmission paths can be established so long as the valve tower arrangements are not complex. Short signal transmission paths are necessary because control signal transmission is accomplished via light waveguides and the transmission sections which are free of intermediate amplifiers are limited to lengths of about 30 m in fiber optic cables.

This known arrangement fulfills its purpose well for the transmission of relatively low power. For the transmission of higher power, however, this arrangement touches the limit of its economic feasability.

Another approach has been taken to assemble valve towers of the type described above from uniform valve assemblies or modules in a building block fashion. This technique is known from DE-OS3605337.

If the arrangement of DE-OS3404076 is constructed with the modules of the second application and if the transmitted power is to be increased, requiring an increase in the number of modules, a problem arises. In a valve tower associated with a specific secondary winding, a voltage will develop between connection points of the individual phases of the secondary winding and modules of the same tower. The voltage between the individual stories or levels of each tower corresponds to a respective peak value of the AC voltage in question which, of course is higher than the root mean square RMS, voltage by a factor of 2. It is therefore necessary to provide larger insulating spaces between the individual modules when the number of modules and therefore voltage difference are increased.

SUMMARY OF THE INVENTION

This invention overcomes the disadvantages of the converter arrangements described above. In order to overcome these disadvantages this invention provides a design for valve towers, which include a stacking of thyristor subassemblies, whereby a desired power throughput can be achieved by varying the number of subassemblies. The insulation between subassembly levels or stories remains the same independent of throughput.

In this invention a separate valve tower is provided for each of the phases of the secondary windings.

According to this invention, the length of control lines to the thyristor subassemblies designed as light waveguides such as fiber optic cables, do not exceed a permissible magnitude. Also, the lines for connecting lines on the AC side of the converters between the valve towers and room feed-throughs of the secondary terminals of the converter transformers are as short as possible and are arranged so as to avoid crossing each other. This invention provides a converter system for coupling two high voltage three-phase networks, comprising:

a first converter transformer and a second converter transformer coupled to a first one of the two networks;

a third converter transformer and a fourth converter transformer coupled to a second one of the two networks;

said first and third converter transformers each comprise,
    a first secondary winding including three phases that are Y-connected, and said second and fourth converter transformers each comprise,
    a second secondary winding including three phases that are delta connected;

a first semiconductor network coupled to said first and second converter transformers;

a second semiconductor network coupled to said third and fourth converter transformers, control circuitry coupled to said first and second semiconductor networks and producing control signals so that one of said semiconductor networks acts as a rectifier and one of said semiconductor networks acts as an inverter;

wherein each semiconductor network comprises, a plurality of valve towers, the number of valve towers being equal to the number of phases of the two secondary windings of the two converter transformers coupled to said semiconductor network;

wherein each valve tower comprises, a plurality of modules stacked atop one another, where the number of modules in the valve towers depends upon the desired power throughput, wherein each module comprises,
    a valve choke, and
    two thyristors,
a uniform insulator spacer disposed between adjacent modules in the valve tower;

wherein each of the phases of the secondary windings is coupled to a rectifier bridge composed of a plurality of modules of one of said valve towers.

The valve towers have a height defined by the number of modules in the tower. The phases associated with a given tower may be connected to the tower at approximately the half height portion of the tower.

The valve towers may be disposed in a valve housing. They may be arranged in the housing in two parallel rows, one associated with each converter transformer.

This invention achieves DC short couplings for different power transfers that can be constructed in accordance with the same design concept so that the respective power matching can be made by a corresponding number of modules forming a tower, with the same insulating spacing between each module. A largely standardized design is thereby achieved having short couplings.

The line lengths for the fiber optic control cables remain sufficiently short up to a total throughput power of 500MW to permit a design without requiring additional space or a basement for base electronics for controlling the semiconductors. This invention also results in a configuration whereby a hall crane of a maximum one ton load capacity is sufficient and whereby repair work can be limited to a replacement of standardized components so that by using a small storage capacity for spares shut down times, in the case of repairs, remain short.

BRIEF DESCRIPTION OF THE DRAWINGS

An embodiment example of the invention will be explained in greater detail in the following, making reference to the drawings where.

DETAILED DESCRIPTION

Figure 1:
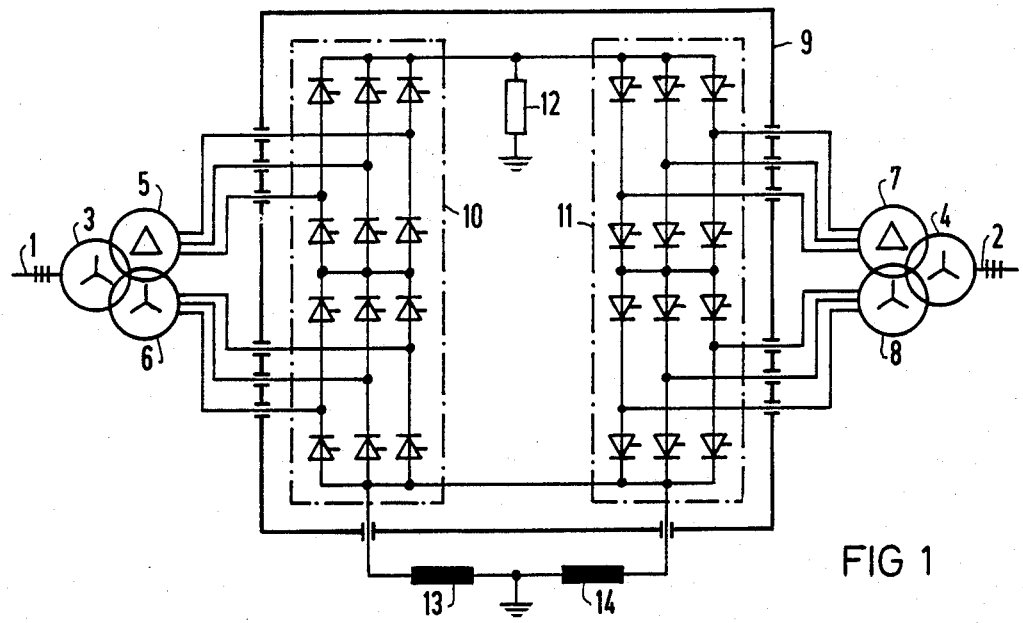
FIG. 1 shows an overall circuit diagram of a high voltage DC short coupling for linking two asynchronous high voltage networks.

According to the overall circuit diagram of FIG. 1, the asynchronous three-phase overhead lines of the three-phase networks 1, 2 to be connected to each other are brought to the primary windings of the associated three-phase transformers 3, 4. The secondary windings of the three-phase transformers 5, 6 and 7, 8 are brought via feedlines R1, S1, T1; R2, S2, T2; R3, S3, T3 as well as R4, S4, T4 inward to the associated valve groups of the two twelve-pulse-rectifier bridge circuits. One of the two secondary windings of each of the transformers associated with the two networks 1, 2 is Y-connected and the other secondary winding is delta-connected. The two rectifier circuits, 10, 11 are connected on the DC side with their negative poles grounded via a voltage divider 12 directly and with the positive poles connected to each other via smoothing chokes 13, 14, whereby the line connecting the smoothing chokes is also grounded. These smoothing chokes 13, 14 serve on the one hand to reduce DC ripple and on the other hand to limit short circuit current in the event of valve short circuits. The electrical circuit itself is known and needs no detailed explanation.

Figure 2:
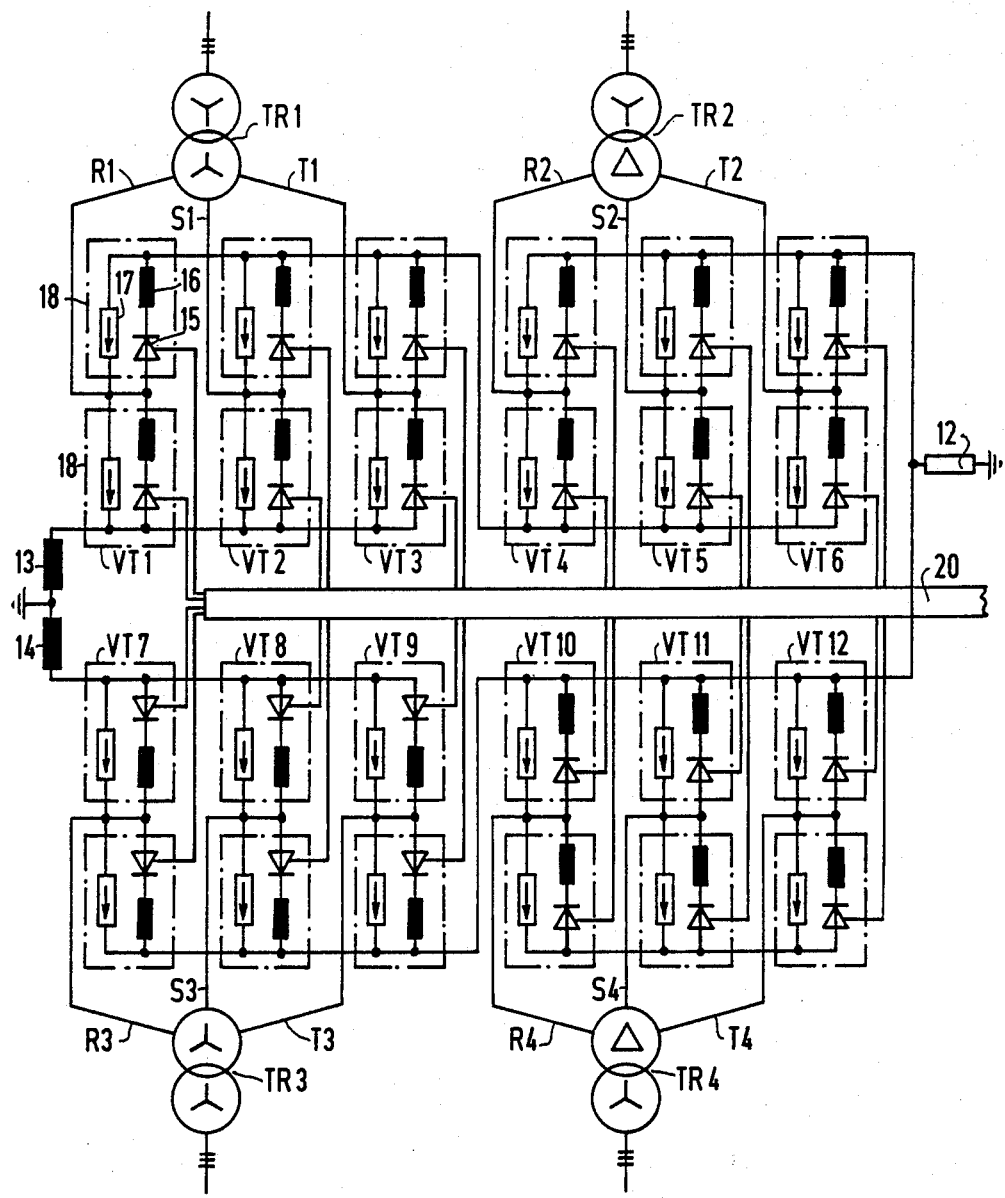
FIG. 2 is a schematic presentation of a two story twelve valve tower configuration.

FIG. 2 illustrates how the thyristor subassembly is constructed from thyristors 15, valve chokes 16 and over voltage arrestor 17 are designed in principle in the form of a module 18. For the sake of simplicity only two modules per tower are shown. The two modules are connected to one another so that the thyristors form a rectifier bridge. Each module constitutes a level or story in its respective valve tower.

There are a total of twelve valve towers VT1 to VT12. Each contains a rectifier bridge formed by the semiconductors of its modules. The electrical circuit corresponds to that according to FIG. 1 and needs no detailed explanation. Connecting lines R1, S1, T1 of the Y-connected phases of the secondary winding of transformer TR1 are associated with the valve towers VT1, VT2 and VT3 respectively. These lines are connected to their respective towers at the vertical center of the tower. That is, the modules of the tower define a tower height and the lines are connected to the approximate midpoint of this tower height. Similarly, the towers VT4, VT5 and VT6 are connected to lines $R_2$, $S_2$, $T_2$ of the delta connected phases of the secondary winding of transformer TR2; the towers of VT7, VT8 and VT9 are connected to lines $R_3$, $S_3$, $T_3$ of the transformer TR3; and the towers of VT10, VT11 and VT12 are connected to lines $R_4$, $S_4$, $T_4$ of the delta connected phases of the secondary winding of transformer TR4.

With the tower design illustrated and the connection of the terminals at the vertical center of the towers, the installation of the AC feed lines can be made particularly advantageous electrically. The feed through insulators 19 of FIG. 3 of the terminals of the secondary transformers can all be arranged at approximately equal spacings in the walls of valve housing 9 so that the shortest possible connecting lines between the transformers and the valve towers are provided.

The use of individual valve towers for each phase and the use of terminals at ½ the height of the individual valve towers leads to particularly short AC connections that are free of crossings and detours. Thereby the electrical and magnetic interactions between the feed lines are limited to a minimum. This physically advantageous arrangement manifests itself particularly clearly in the top view into the valve housing in FIG. 3.

Figure 3:
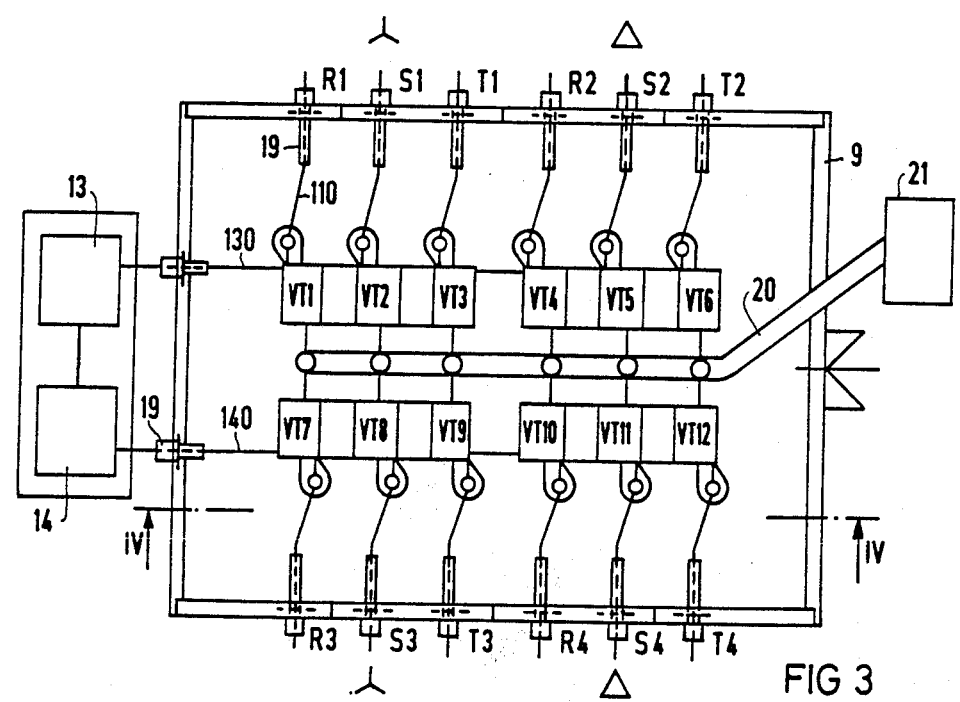
FIG. 3 illustrates a top view of a valve housing for a throughput power of 500MW with a top of the valve housing removed.

FIG. 3 illustrates that smoothing chokes 13 and 14 are disposed to be external to the valve housing 9. Feedthrough insulators 19 permit lines 130 and 140 to connect smoothing chokes 13 and 14 to towers VT1 and VT7 respectively. The lines 130 and 140 are arranged in such a manner as to establish the connections between the subassemblies and the smoothing chokes as illustrated in FIG. 2.

The towers are arranged in two parallel rows, VT1 to VT6 and VT7 to VT12 whereby in each row the towers are disposed side by side. Between the two rows a fiber optic cable is disposed. This cable acts as a control line for the active thyristors of the subassemblies. Cable 20 extends beyond the valve housing 9 to central control circuitry 21 which sends signals along cable 20 to control the thyristors. The three terminals of each of the four secondary windings are each associated with one of the towers and a connection between a tower and its corresponding terminal is established via lines 110 passing through feedthrough insulators 19.

Figure 4:
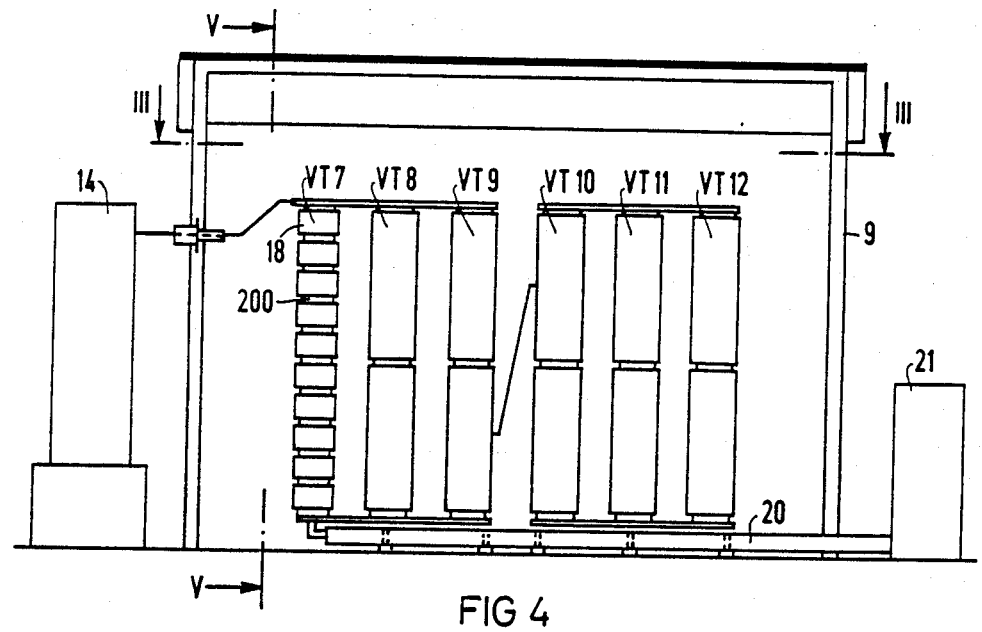
FIG. 4 illustrates the same valve housing as in FIG. 3 in a sectionalized sideview.

The view along a longitudinal cross section of the valve housing 9 in FIG. 4 shows that the line arrangement on the DC side to the smoothing chokes 13, 14 arranged outside can be made by a short straight line 130 or 140, which does not cross the AC side and the connections established via lines 110.

FIG. 4 also illustrates the individual modules which constitute the towers. Tower VT7 is shown composed of ten modules 18 stacked atop one another. The modules are separated by equal spacing of insulating material 200. Each tower VT1 to VT12 may have a similar construction.

Figure 5:
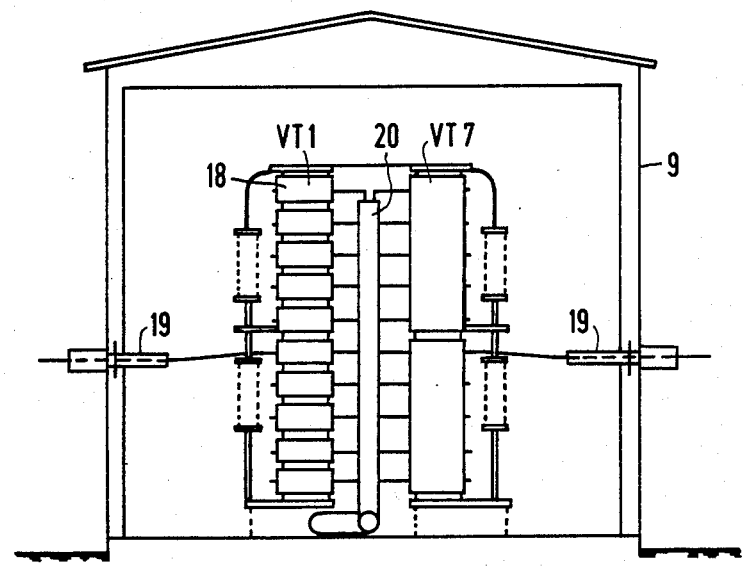
FIG. 5 illustrates the same valve housing as FIG. 3 in a sectionalized front view.

The AC terminals of the rectifier bridges formed by the modules of a tower are also located at the vertical center of the tower. It becomes clear from FIG. 5 that the feedthrough insulators 19 for allowing lines 110 to enter the valve housing 9 from the respective secondary windings are located approximately at ½ the height of the valve towers. VT1 to VT12 (VT2 to VT6 and VT7 to VT11 not shown). This configuration makes it possible to have a particularly short arrangement of the connection lines. FIG. 5 also clearly illustrates the modular design of the turrets as modules 18 of tower VT1 are disclosed. Each of the towers may consist of 10 modules stacked in levels or stories (modules 18). Each module may have an identical design. The towers may have the same insulating spacings between each of the modules 18 and between the adjacent towers along one of the rows of towers of VT1 to VT6 or VT7 to VT12. The assembly of 10 modules per tower corresponds to a power throughput of 500MW. Varying the number of modules per tower permits a variation in the power throughput. The number of modules is varied in increments of two, with the minimum numbe of modules being two modules as illustrated in FIG. 2. The fiber optic cables have a maximum length to the central control circuitry 21, also known as base point electronic circuitry, of about 35 m. This makes possible an inexpensive design of a valve housing 9 without the need to house the control circuitry as well, while providing an interference free arrangement of the electronic base-point circuitry outside of the valve housing.

What I claim is:

1. A system for coupling two high-voltage three phase networks comprising:
    a first converter transformer and a second converter transformer coupled to a first one of the two networks;
    a third converter transformer and a fourth converter transformer coupled to a second one of the two networks;
    said first and third converter transformers each comprise,
        a first secondary winding including three phases that are Y-connected, and
    said second and fourth converter transformers each comprise,
        a second secondary winding including three phases that are delta connected;
    a first semiconductor network coupled to said first and second converter transformers;
    a second semiconductor network coupled to said third and fourth converter transformers,
    control circuitry coupled to said first and second semiconductor networks and producing control signals so that one of said semiconductor networks acts as a rectifier and one of said semiconductor networks acts as an inverter;
    wherein each semiconductor network comprises, a plurality of valve towers, the number of valve towers being equal to the number of phases of the two secondary windings of the two converter transformers coupled to said semiconductor network;

wherein each valve tower comprises, a plurality of modules stacked atop one another, where the number of modules in the valve towers depends upon the desired power throughput, wherein each module comprises, a valve choke, and two thyristors, a uniform insulator spacer disposed between adjacent modules in the valve tower;

wherein each of the phases of the secondary windings is coupled to a rectifier bridge composed of a plurality of modules of one of said valve towers.

2. The converter system of claim 1 wherein each valve tower has a height defined by the extreme faces of the extreme modules of the valve tower and each phase is connected to its associated valve tower at approximately one half the height of the valve tower.

3. The converter system of claim 1 wherein said plurality of valve towers are disposed in a valve housing wherein all of the valve towers associated with said first and second converter transformers are arranged in a first row within said housing and all of the valve towers associated with said third and fourth converter transformers are arranged in a second row within said housing, said first row being parallel to said second row.

4. The converter system of claim 3 wherein said control circuitry is disposed external to said valve housing and is coupled to said first and second semiconductor networks with fiber optic cable.

5. The converter system of claim 1 wherein said plurality of valve towers are disposed in a valve housing wherein all of the valve towers associated with said first and second converter transformers are arranged in a first row within said housing and all of the valve towers associated with said third and fourth converter transformers are arranged in a second row within said housing, said first row being parallel to said second row;

wherein each of said valve towers has a height defined by the extreme faces of the extreme modules of the valve tower and;

wherein said valve housing further comprises insulator feed-throughs; and wherein each phase of each of the secondary windings is connected to its associated valve tower at approximately one half the height of the valve tower via connecting lines passing through said insulator feed throughs.

6. The converter of claim 1 further comprising:

a first smoothing choke coupled to said first semiconductor network; and a second smoothing choke coupled to said second semiconductor network.

7. The converter system of claim 6 wherein said plurality of valve towers are disposed in a valve housing wherein all of the valve towers associated with said first and second converter transformers are arranged in a first row within said housing and all of the valve towers associated with said third and fourth converter transformers are arranged in a second row within said housing, said first row being parallel to said second row;

wherein each of said valve towers has a height defined by the extreme faces of the extreme modules of the valve tower and;

wherein said valve housing further comprises insulator feed-throughs; and wherein each phase of each of the secondary windings is connected to its associated valve tower at approximately one half the height of the valve tower via connecting lines passing through said insulator feed-throughs.

* * * * *